US006670538B2

(12) United States Patent
Wilner et al.

(10) Patent No.: US 6,670,538 B2
(45) Date of Patent: Dec. 30, 2003

(54) THERMAL RADIATION SENSOR

(75) Inventors: Leslie Bruce Wilner, Palo Alto, CA (US); Andrew J. Meyer, Rockwood, TN (US); James Tjan-Meng Suminto, Fremont, CA (US); Joseph Salvatore Fragala, San Jose, CA (US)

(73) Assignee: Endevco Corporation, San Juan Capistrano, CA (US)

( * ) Notice: Subject to any disclaimer, the term of this patent is extended or adjusted under 35 U.S.C. 154(b) by 48 days.

(21) Appl. No.: 10/039,282

(22) Filed: Jan. 2, 2002

(65) Prior Publication Data

US 2002/0139410 A1 Oct. 3, 2002

Related U.S. Application Data

(60) Provisional application No. 60/259,898, filed on Jan. 5, 2001.

(51) Int. Cl.[7] .......................... H01L 35/02; H01L 35/34
(52) U.S. Cl. .................... 136/230; 136/213; 136/201; 136/224; 136/232; 136/240; 136/241; 257/467; 438/54; 438/55
(58) Field of Search ................................ 136/213, 201, 136/224, 232, 240, 241, 230; 257/467; 438/57, 54, 55

(56) References Cited

U.S. PATENT DOCUMENTS

| 4,111,717 | A | | 9/1978 | Baxter ........................ 136/225 |
|---|---|---|---|---|
| 4,456,919 | A | * | 6/1984 | Tomita et al. ............... 374/132 |
| 4,722,612 | A | * | 2/1988 | Junkert et al. ............... 374/124 |
| 4,928,012 | A | * | 5/1990 | Lorenz ..................... 250/338.1 |
| 5,056,929 | A | * | 10/1991 | Watanabe et al. ........... 374/181 |
| 5,059,543 | A | | 10/1991 | Wise et al. ................... 438/54 |
| 5,100,479 | A | | 3/1992 | Wise et al. ................. 136/225 |
| 2002/0139410 | A1 | * | 10/2002 | Wilner et al. ............... 136/224 |

FOREIGN PATENT DOCUMENTS

EP          1039280 A2  *  9/2000

* cited by examiner

*Primary Examiner*—Alan Diamond
(74) *Attorney, Agent, or Firm*—Hamilton, Brook, Smith & Reynolds, P.C.

(57) ABSTRACT

A radiation sensor which includes a thermopile for detecting radiant energy. The thermopile and a support rim for the thermopile are fabricated as an integrated unit to form a support chip. The support chip is mated to a mating chip so that the thermopile is positioned in an inner cavity region of the radiation sensor. The sensor has a window which permits the transmission of radiant energy into the enclosure such that the radiant energy impinges upon a central absorber region of the thermopile.

30 Claims, 7 Drawing Sheets

THERMAL RADIATION SENSOR

RELATED APPLICATION

This application claims the benefit of U.S. Provisional Application No. 60/259,898, filed on Jan. 5, 2001, the entire teachings of which are incorporated herein by reference.

BACKGROUND

In radiometery, thermal radiation sensors are used to detect radiant infrared energy. A typical example of such sensors are thermopiles which generally consist of a multiplicity of thermocouples connected in series. Each thermocouple is made of a pair of unlike materials connected at two points, one point being a hot junction and the other being a cold junction. When the junctions are at different temperatures, an electromotive force is developed across the thermocouple. In a typical thermopile, the hot junctions are located in an absorber area of the thermopile, and the cold junctions are located at an outer rim region. Most thermopiles are made as a planar array supported on a film which in turn is supported by the outer rim. These framed structures are usually held within a hermetic enclosure to prevent undesirable gases from entering and/or to seal in a desired gas. The enclosure also has a window to permit radiation to pass through the enclosure and impinge upon the absorber area of the thermopile. Although lead wires extend from the thermopile planar array through the enclosure, the feedthroughs for the lead wires are also hermetically sealed, that is, gases cannot penetrate the passageway through which the lead wires extend.

SUMMARY

The typical thermopile planar array is very delicate and can be easily damaged when handled, for example, during fabrication of the sensor. Thus placing the thermopile in the enclosure is both laborious to the assembler and hazardous to the thermopile. As such, it is desirable to fabricate the enclosure, or at least a portion of the enclosure, along with the thermopile to increase cost savings by using less labor and generating a larger yield of thermopiles.

The present invention implements a radiation sensor which includes a thermopile for detecting radiant energy. The thermopile and a support rim for the thermopile are fabricated as an integrated unit to form a support chip. The support chip is mated to a mating chip so that the thermopile is positioned in an inner cavity region of the radiation sensor. The sensor has a window which permits the transmission of radiant energy into the enclosure such that the radiant energy impinges upon a central absorber region of the thermopile.

In one aspect of the invention, the sensor includes a support chip having an outer rim and a thermopile supported by the rim. The sensor also includes a mating chip having a rim region and a window region. The rim region of the mating chip is mated to the outer rim of the support chip to form a hermetically sealed enclosure in which the thermopile resides.

Embodiments of this aspect can include one or more of the following features. The thermopile includes a plurality of thermocouples connected in series and an inner absorber region. A hot junction of each thermocouple is positioned in this inner absorber region, and a cold junction of each thermocouple is positioned in the rim regions of the support chip and the mating chip. The thermocouples can be made from bismuth and antimony, or from other suitable materials such as, for example, chromel, alumel, and constantan, as well as semiconductor materials, such as P-type silicon.

A cap of the support chip and the outer rim can be made from a common semiconductor wafer, for example, silicon, and the materials of the thermopile can be deposited on this wafer. The mating chip can be made from another wafer. Alternatively, the outer rim can be made from one wafer, with the materials of the thermopile deposited on this wafer, and a window layer can be made from another wafer, with the window layer being mated to a one side of the support chip. The mating chip can be made from a third wafer such that it is mated to the other side of the support chip.

In some embodiments, the radiant energy which impinges on the inner absorber region of the thermopile can have a wavelength that ranges from about 1 $\mu$m to about 14 $\mu$m.

The thermopile can have at least two leads which are attached to a respective terminal positioned on an exterior surface of the sensor. Each terminal can be positioned in a respective etch pit of the support chip, or the terminals can lie in the same plane as the thermopile in a common etch pit. The sensor can also include a reference terminal positioned on the exterior surface.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1B:
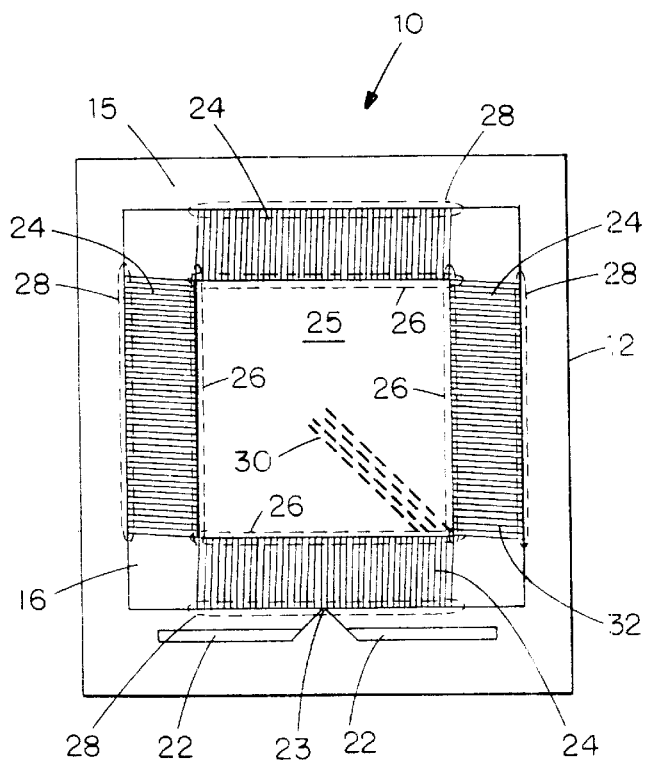
FIG. 1B. a mid-plan view of the radiant thermal sensor along line 1B—1B of FIG. 1A.
Figure 1C:
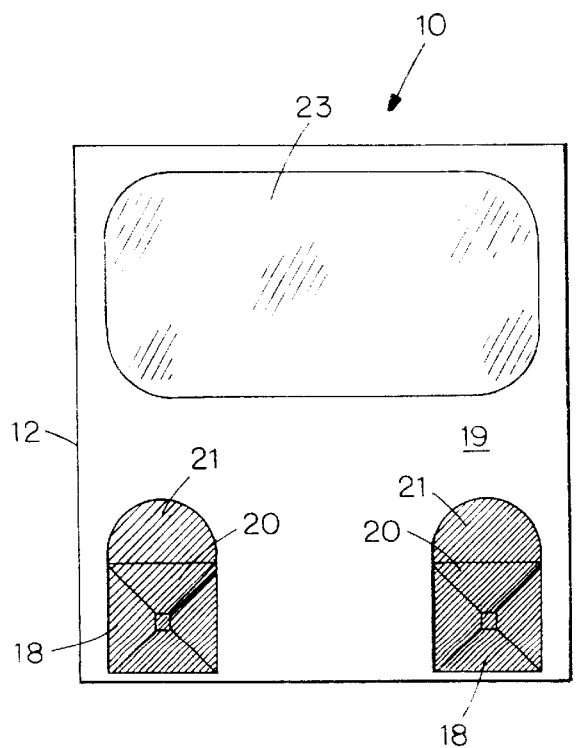
FIG. 1C is a bottom view of the radiant thermal sensor along the line 1C—1C of FIG. 1B.
Figure 1A:
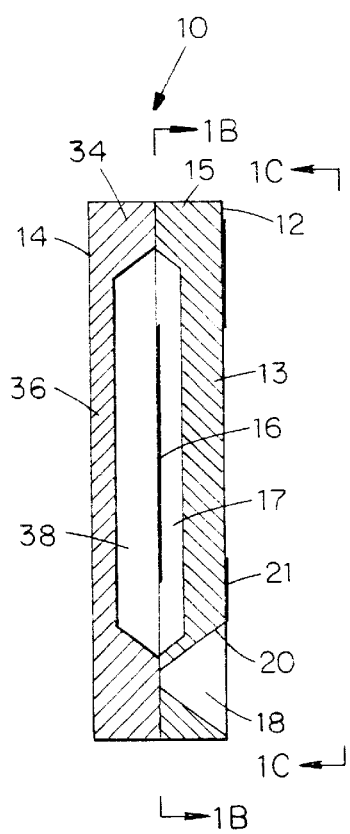
FIG. 1A is a side cross-sectional view of a radiant thermal sensor in accordance with the present invention.

A description of preferred embodiments of the invention follows.

Referring to FIGS. 1A through 1D, there is shown a thermal radiation sensor 10 for detecting infrared radiant energy. The sensor 10 includes a support chip 12 mated with a mating chip 14. The support chip 12 includes a cap 13, an outer rim 15, and a thermopile 16, which with the cap 13 define a cavity 17. The support chip 12 also includes a pair of etch pits 18 which provide access to a pair of terminals 20, typically made from a precious metal such as gold. Each terminal is connected to a respective thermopile lead 22. The terminals extend from a plane in which the leads 22 are positioned to an outer surface 19 of the support chip 12, and terminate as semi-circular pads 21. Located on the same side of the support chip as the terminals 20 is a thermal heat sink 23. The thermal heat sink 23 provides mechanical support for mounting the sensor 10 and is made typically from the same conductive material as terminals 20. The thermal heat sink also provides a reference temperature when connected, for example, to a thermistor.

The thermopile 16 includes a central absorber region 25 blackened to absorb radiant energy, and a multiplicity of thermocouples 24 connected in series positioned around the central absorber region 25. The series of thermocouples 24 are connected in turn to the thermopile leads 22 at a junction 23. Each thermocouple 24 consists of a pair of dissimilar materials, such as antimony and bismuth, connected at a hot junction 26 that is located on the central absorber region 25, and a cold junction 28 located on the outer rim 15 of the support chip 12.

Bismuth and antimony have Seebeck coefficients of −73 $\mu V/°$ C. and +49 $\mu V/°$ C., respectively. Other thermocouple materials include chromel (Seebeck coefficient=+28 $\mu V/°$ C.), alumel (−12.9 $\mu V/°$ C.), constantan (−35.1 $\mu V/°$ C.), as well as semiconductor materials, such as P-type silicon (+450 $\mu V/°$ C.).

The central absorbing region 25 is provided with a series of slots 30, and another series of slots 32. Each slot 32 is positioned between adjacent legs of the thermocouples 24. These slots 30 and 32 facilitate creating the cavity 17 by an etching process, the details of which are discussed below. The slots 32 also decrease the heat loss of the thermopile 16, thereby increasing its efficiency.

The mating chip 14, typically fabricated from a single silicon wafer, is provided with a rim 34 and a window region 36, which with the rim 34 define a cavity 38. The outer rim 15 of the support chip 12 and the rim 34 of the mating chip 14 are hermetically sealed together to prevent the introduction of undesirable gases and/or to enclose a known gas within the interior region defined by the cavities 17 and 38 in which the thermopile 16 is positioned. The passageway from the junction 23 of the thermopile 16 to the etch pits 18 is also hermetically sealed to prevent the penetration of gases into the inner region of the sensor 10.

The sensor 10 is typically about 2.5 mm square and about 1 mm thick, and the thermopile is about 1.5 mm square.

Figure 1D:
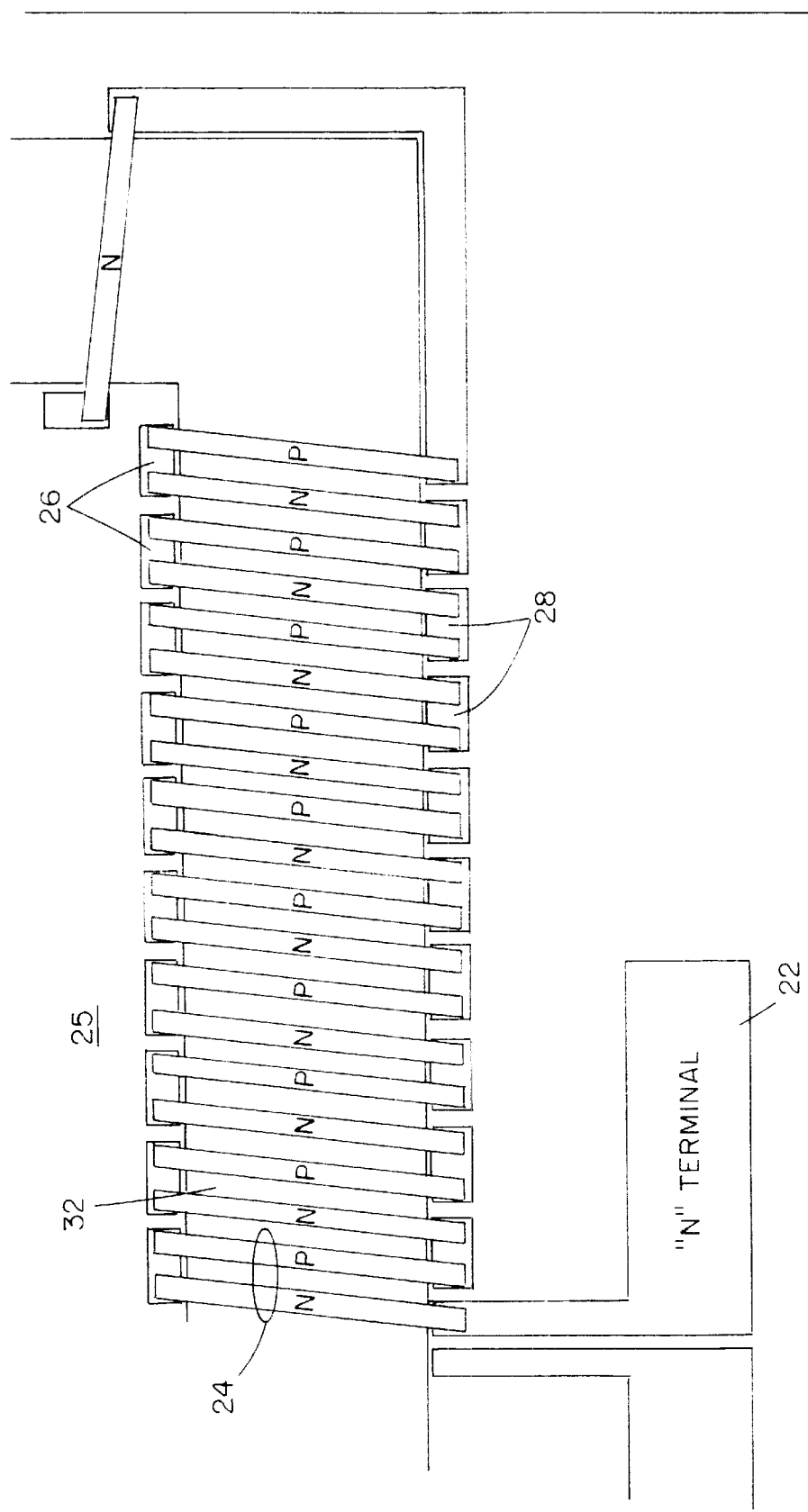
FIG. 1D is a close-up view of a portion of a thermopile of the radiant thermal sensor of FIGS. 1A, 1B, and 1C.
Figure 2:
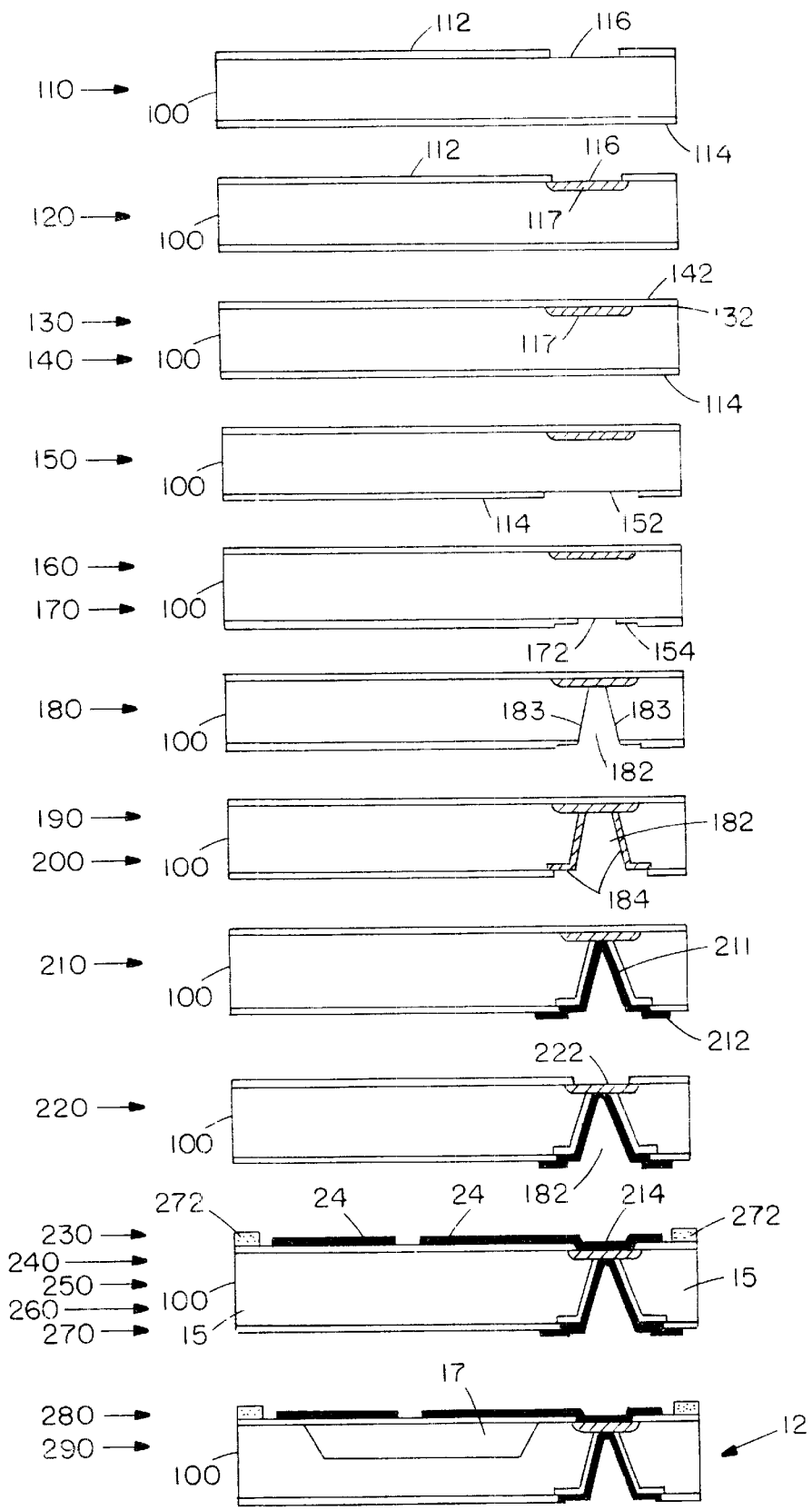
FIG. 2 is a schematic illustration of a sequence of steps for fabricating the radiation thermal sensor of FIGS. 1A, 1B, 1C, and 1D.

In the embodiment illustrated in FIGS. 1A through 1D, the cap 13 and the outer rim 15 of support chip 12 are made from a single silicon wafer, and the thermopile 16 is deposited on this wafer to form an integrated unit. An illustrative sequence of steps to fabricate support chip 12 from a single silicon wafer 100 is shown in FIG. 2. In a first step 110, a top layer 112 and a bottom layer 114 of $SiO_2$ are applied to the silicon wafer 100. An opening 116 is made in the top layer 112 with a photolithography process. Then in a step 120, the opening 116 is doped with boron 117.

Next, in a step 130, the top layer 112 of $SiO_2$ is removed and a thinner layer of $SiO_2$ 132 is deposited. This step is followed by a step 140 in which a layer of $Si_3N_4$ 142 is applied to the thin top layer of $SiO_2$ 132. Subsequently, in a step 150, a bottom hole 152 is made in the bottom layer 114 of $SiO_2$ with a photolithography process. Then, in a step 160, the bottom hole 152 is covered by a thin oxide layer 154, and in a step 170, a smaller hole 172 is made in the thin oxide layer 154.

An anisotropic etching process is used in a step 180 to etch out a cavity 182. The anisotropic process enables the etching process to create a cavity with sloped walls 183. Next, in a step 190, the thin oxide layer 154 is removed, and, in a step 200, the walls 183 of the cavity 182 is doped with boron 184 to create a P/N junction.

Subsequently, in a step 210, a precious metal 211, for example, gold, is applied to the walls 183 of the cavity 182, as well as to a region 212 immediately outside the cavity 182. And in a step 220, a hole 222 is made in the top layer of $Si_3N_4$ to make an electrical interconnect with the gold 211 deposited on the walls 183 of the cavity 182.

Next, the thermocouples 24 are fabricated in a sequence of steps 230–260 in which layers of material are applied on the wafer and patterned to a desired configuration. First, in the step 230, a layer of gold 214 is applied to the wafer to serve as conductive interconnects at both the hot junctions 26 and the cold junctions 28 for the thermocouples (FIG. 1D). Then in step 240, a metal, for example, bismuth, is applied, followed by, in step 250, the application of a second metal such as antimony. Finally, in the step 260 a protective insulating layer is applied to the top of the thermocouples 24.

Following the fabrication of the thermocouples 24, in a step 270, a gold/tin alloy 272 is applied to the outer rim 15 to facilitate solder bonding support chip 12 with mating chip 14. Then, in a step 280, the slots 30 and 32 of thermopile 16 are made using a photolithography process. Typically, the wafer 100 has a (100) orientation with a [110] alignment reference, and the slots 30 are aligned in the [100] orientation to permit anisotropic etching of the cavity 17, as in a step 290. In other embodiments, isotropic etching of silicon wafers of any orientation is performed.

Finally, the completed support chip 12 is mated with the mating chip 14 to provide the thermal radiation sensor 10 with the thermopile 16 enclosed within a hermetically sealed inner region of a known atmosphere.

In use, the operator first connects the terminals 20 of the sensor 10, for example, to a voltmeter, and the heat sink 23 to a thermistor to provide a reference temperature, which is identical to the temperature sensed by the cold junctions 28 located at the outer rim 15. The operator then positions the sensor 10 to measure the temperature in a particular application. The radiant energy, having a wavelength ranging from about 1 $\mu$m to about 14 $\mu$m, transmits through the window 36 of mating chip 14, and impinges upon the central absorber region 25 of thermopile 16, which causes the temperature of this region 25 to increase or decrease, depending on whether the temperature of the radiation source is above or below the reference temperature, respectively. The hot junctions 26 located at the central absorber region 25 senses the temperature rise of the central absorber region 25. The temperature differential between the hot junctions 26 and the cold junctions 28 creates an electromotive force across the thermocouples 24, which the voltmeter measures as a voltage drop. Since the thermocouples are identical and are connected in series, the total voltage drop of the thermopile 16 is the product of the electromotive forces of the individual thermocouples 24 and the number of thermocouples. With a known Seebeck coefficient for the thermocouples 24, the operator determines the actual temperature differential by dividing the voltage drop across an individual thermocouple by its Seebeck coefficient. Since the actual reference temperature is also known, the operator easily calculates the temperature of the radiant energy source by subtracting or adding the reference temperature to the temperature differential.

Figure 3A:
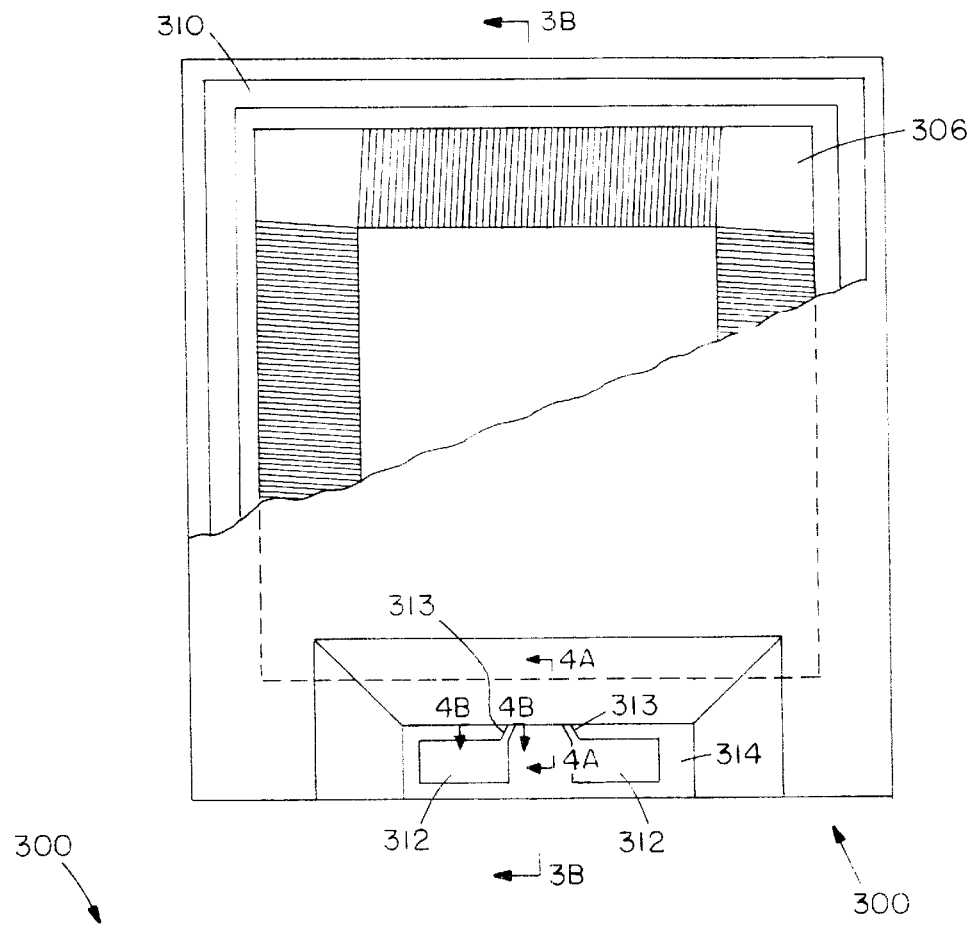
FIG. 3A is a top partially cutaway view of an alternative embodiment of a radiant thermal sensor in accordance with the present invention.
Figure 3B:
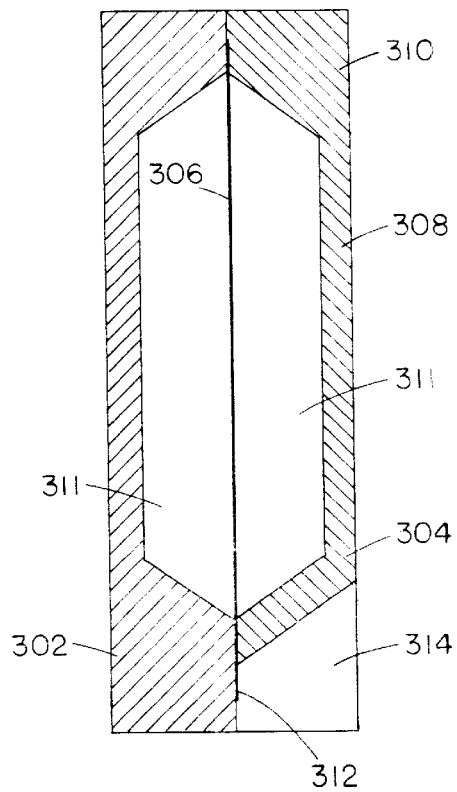
FIG. 3B is a side cross-sectional view of the radiant thermal sensor along the line 3B—3B of FIG. 3A.

Referring now to FIGS. 3A and 3B, there is shown an alternative embodiment of a thermal radiant sensor 300. The structure of the sensor 300 is nearly identical to that of the sensor 10 described above. For example, the sensor 300 includes a mating chip 302 and a support chip 304. A cap 308 and an outer rim 310 of the support chip 304 are made from single silicon wafer. As a completed unit, the thermopile 306 resides in a cavity region 311 of the sensor 300. The sensor 300 also includes a pair of terminals 312 which are electrically connected by a pair of leads 313 to the thermopile 306. Unlike the sensor 10, the terminals 312 of the sensor 300 are positioned entirely in the same plane as the thermopile 306 in a single etch pit 314.

Figure 4A:
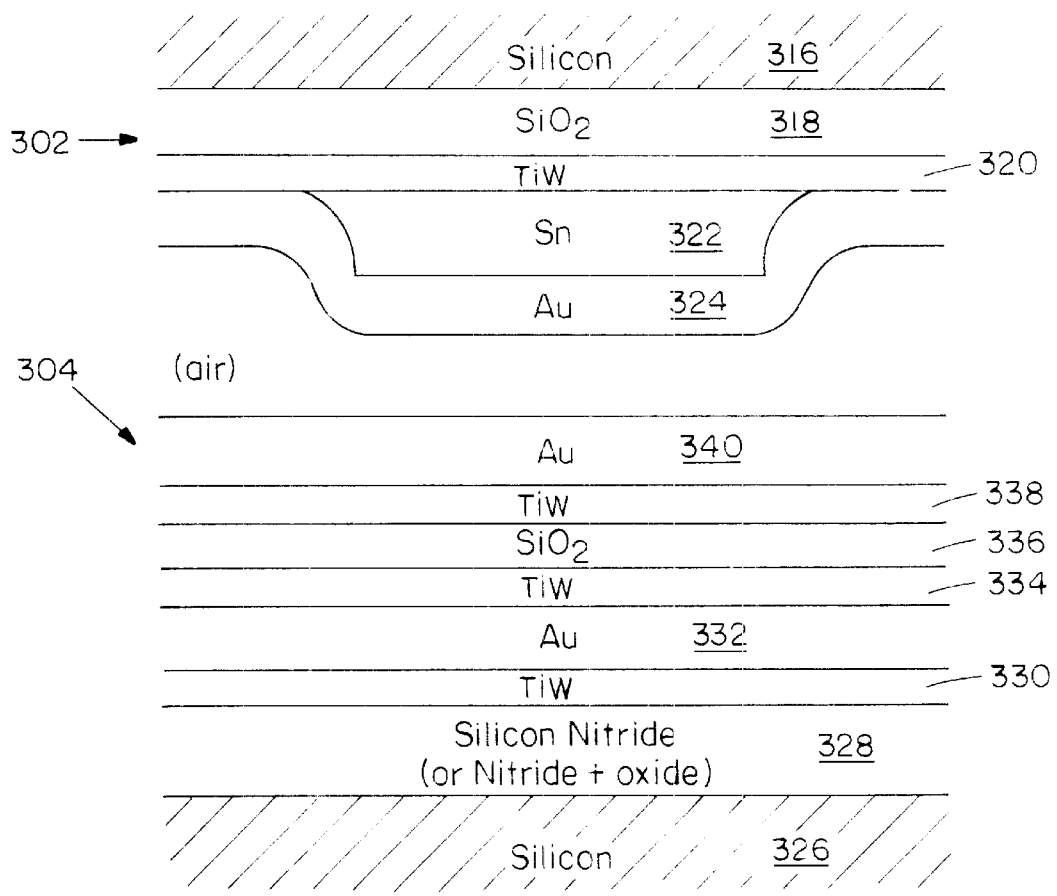
FIG. 4A is a schematic illustration viewed along line 4A—4A of FIG. 3A depicting the layers of the radiation thermal sensor prior to fabrication.

Referring now to FIG. 4A, the requisite layers of deposited material to form a hermetically sealed lead passage for the leads 313 of the sensor 300 are shown prior to fabrication. The mating chip 302 is provided with a silicon substrate 316, a 0.3 $\mu$m layer of $SiO_2$ (silicon oxide) 318, a 0.06 $\mu$m layer of TiW (titanium tungston) 320, a 0.30 $\mu$m layer of Sn (tin) 322, and a 0.20 $\mu$m layer of Au (gold) 324. The support chip 304 is also provided with a silicon substrate 326, as well as a 0.7 $\mu$m layer of silicon nitride (or nitride and oxide) 328, a 0.06 $\mu$m layer of TiW 330, a 0.14 $\mu$m layer of Au 332, a second layer of TiW 334 having a thickness of 0.06 $\mu$m, an 0.09 $\mu$m insulating layer of $SiO_2$ 336, another layer of TiW 338 having a thickness of 0.06 $\mu$m, and a 0.20 $\mu$m top layer of Au 340. The TiW layer 330, the Au layer 332, and the TiW 334 layer are patterned into terminal traces before the deposition of the $SiO_2$ layer 336.

Figure 4B:
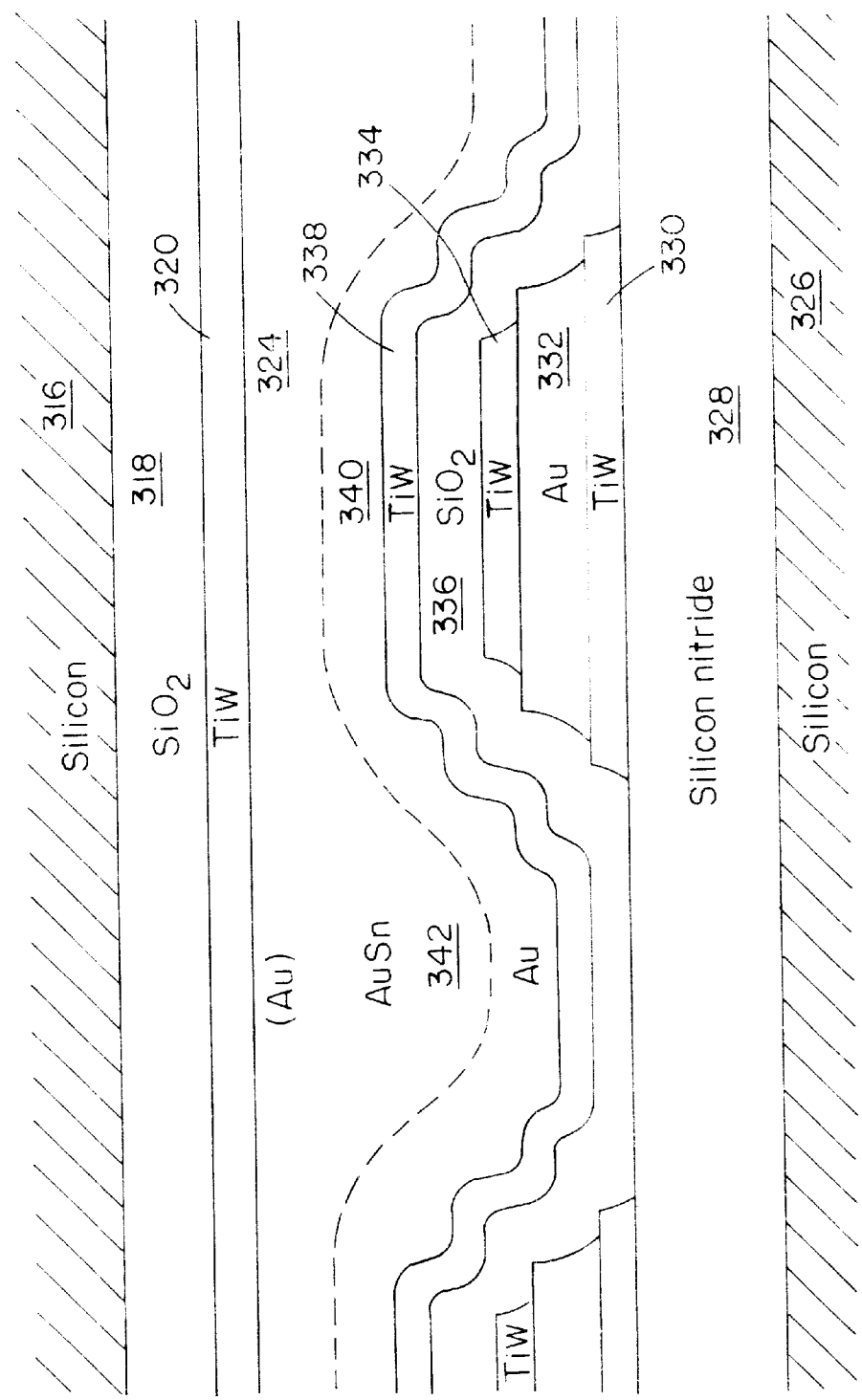
FIG. 4B is a schematic illustration viewed along line 4B—4B of FIG. 3A depicting the layers of the radiant thermal sensor after fabrication.

Referring to FIG. 4B, there is shown the sealed lead passage after the support chip 304 and the mating chip 302 are bonded together. To form the hermetically sealed bond, the two chips are brought together and then heated to the Au/Sn eutectic temperature (or liquidus temperature) such that the gold and tin become a "mushy" fluid. The tin originally in the layer 322 diffuses through the gold layer 324 of the mating chip 302 and incorporates into the outer portion of the gold layer 324 and into the gold layer 340 of the support chip 304 to form a gold/tin layer 342. The entire structure is then cooled so that the materials solidify to form a hermetically sealed lead passage.

Figure 5A:
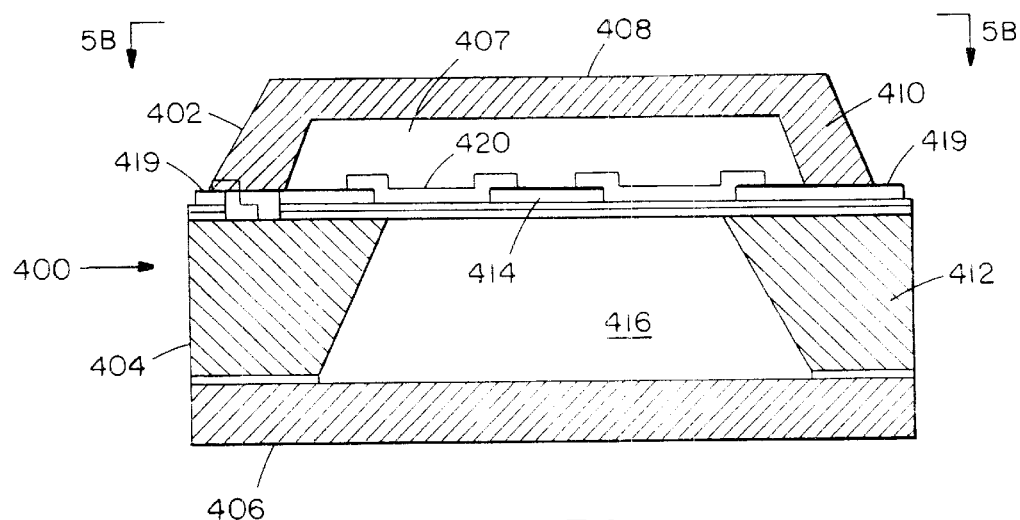
FIG. 5A is side cross-sectional view of another alternative embodiment of a radiant thermal sensor in accordance with the present invention.
Figure 5B:
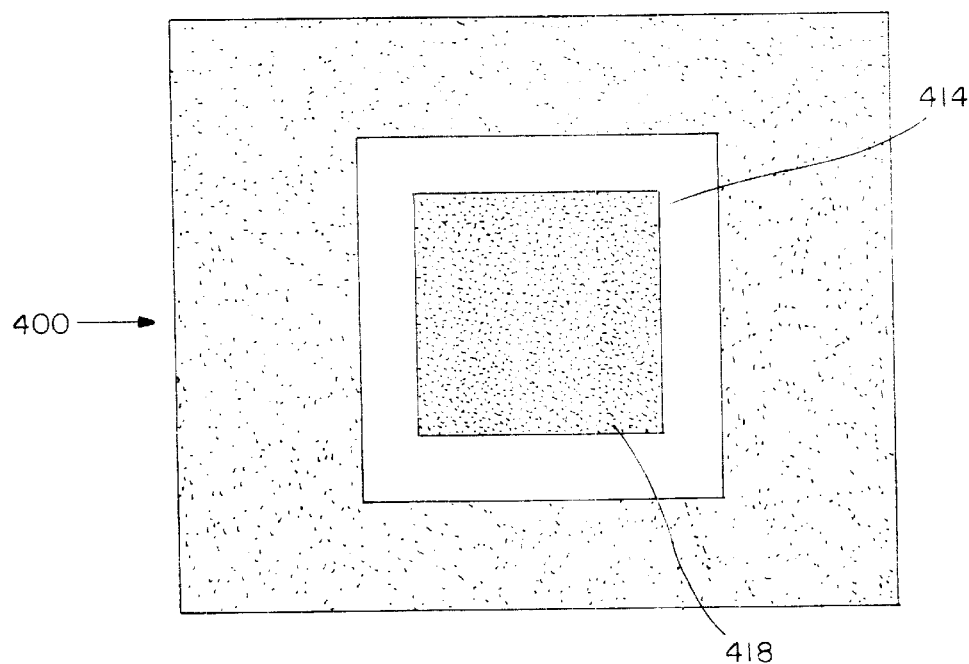
FIG. 5B is a top mid-plane view of the radiant thermal sensor along the line 5B—5B of FIG. 5A.

In the embodiments illustrated above in FIGS. 1A, 1B, and 1C, and 3A and 3B, the cap and the outer rim of the support chip are formed from a single wafer. The cap, however, can be formed from a different wafer than that of the outer rim, as shown in FIGS. 5A and 5B. Here, a thermal radiant sensor 400 includes a mating chip 402, a support chip 404, and a window layer 406.

The mating chip 402 has a cavity 407 defined by a window region 408 and a rim 410 which mates with an outer rim 412 of the support chip 404. The support chip 404 also includes a thermopile 414 supported on the outer rim 412. The window layer 406, the outer rim 412, and the thermopile 414 define a cavity 416. Like the embodiments discussed above, the thermopile includes a central blackened absorber area 418. Further, the thermopile layer 414 also includes gold pads 419 for wire bonding and a multiplicity of thermocouples 420. However, unlike the previous embodiments the window layer 406 is formed from another wafer than that from which the outer rim 412 is fabricated. This facilitates etching the cavity 416 from the side of the support chip 404 opposite that of the thermopile 414. Accordingly, the thermopile 414 does not need to have the slots 30 which are necessary to provide access for the etchant to make the cavity 17 in the embodiment shown in FIG. 1B. Radiant energy is emitted through either the window layer 406 or the window region 408 of the mating chip 402.

While this invention has been particularly shown and described with references to preferred embodiments thereof, it will be understood by those skilled in the art that various changes in form and details may be made therein without departing from the scope of the invention encompassed by the appended claims.

For example, other methods to hermetically seal the support chip 12 and the mating chip 14 of the sensor 10 shown in FIGS. 1A, 1B, 1C, and 1D include gold—gold diffusion bonding and anodic bonding of silicon to a deposited layer of borosilicate glass. Bonding with solderglass frit can be used to bond the two chips of the embodiment discussed in reference to FIGS. 3A,B.

Although the fabrication process outlined above involves anisotropic etching of (100) silicon with etchants such as potassium hydroxide (KOH) at concentrations in water of 20% to 40%, potassium hydroxide in water saturated with isopropyl alcohol (KOH/IPA), water solution of ethylenediamine and pyrocatachol (EDP), or tetramethyl ammoium hydroxide (TMAH), both liquid and gas isotropic etchants can be employed to form the cavity beneath the thermopile. Further, this cavity can have rounded sides rather than angular sides.

What is claimed is:

1. A sensor for detecting radiant energy, comprising:
   a support chip having an outer rim and a thermopile supported by the outer rim; and
   a mating chip having a rim region and a window region, the rim region of the mating chip being mated to the rim of the support chip to form a hermetic seal.

2. The sensor of claim 1, wherein the support chip and the mated chip define an inner cavity in which the thermopile resides.

3. The sensor of claim 1, wherein the thermopile includes a plurality of thermocouples connected in series.

4. The sensor of claim 3, wherein the thermopile includes a central absorber region.

5. The sensor of claim 4, wherein each thermocouple includes a hot junction positioned on the central absorber region.

6. The sensor of claim 4, wherein each thermocouple includes a cold junction positioned on the outer rim of the support chip.

7. The sensor of claim 3, wherein each thermocouple is made of bismuth and antimony.

8. The sensor of claim 3, wherein each thermocouple is made of chromel and alumel.

9. The sensor of claim 3, wherein each thermocouple is made of at least constantan.

10. The sensor of claim 3, wherein each thermocouple is made of at least P-type silicon semiconductor material.

11. The sensor of claim 1, wherein the support chip includes a cap and the cap and the outer rim are made from a first wafer, the thermopile being made of materials deposited on the first wafer, and the mating chip being made from a second wafer.

12. The sensor of claim 1, further comprising a window layer, the window layer being mated to a first side of the support chip and the mating chip being mated to a second side of the support chip, wherein the outer rim of the support chip is made from a first wafer, the mating chip is made from a second wafer, the window layer is made from a third wafer, and the thermopile is made of materials deposited on the first wafer.

13. The sensor of claim 1, wherein the support chip and the mating chip are made from silicon.

14. The sensor of claim 1, wherein radiant energy is able to penetrate the window region of the mating chip and impinge upon an absorber region of the thermopile, the radiant energy having a wavelength ranging from about 1 $\mu$m to about 14 $\mu$m.

15. The sensor of claim 1, wherein the thermopile includes at least two leads, each lead being connected to a respective terminal positioned on an exterior surface of the sensor.

16. The sensor of claim 15, wherein each terminal is positioned in a respective etch pit.

17. The sensor of claim 15, wherein the terminals are positioned in a common etch pit and lie in a plane defined by the thermopile.

18. The sensor of claim 15, further including a reference terminal positioned on the exterior surface of the sensor.

19. A method of fabricating a sensor for detecting radiant energy, comprising:
    forming a support chip with an outer rim and a thermopile supported by the outer rim;
    forming a mating chip with a rim region and a widow region; and
    mating the support chip and the mating chip together.

20. The method of claim 19, wherein the support chip and the mating chip define an inner cavity in which the thermopile resides.

21. The method of claim 19, wherein forming the support chip includes forming a cap of the support chip and the outer rim from a first wafer, and depositing materials of the thermopile on the first wafer, and forming the mating chip includes forming the mating chip from a second wafer.

22. The method of claim 21, wherein the first wafer and the second wafer are made from silicon.

23. The method of claim 19, further comprising forming a window layer from a first wafer, wherein forming the support chip includes forming the outer rim from a second wafer and depositing materials of the thermopile on the second wafer, forming the mating chip includes forming the mating chip from a third wafer, and mating the support chip and the mating chip includes mating the mating chip to a first side of the support chip and mating the window layer to a second side of the support chip.

24. The method of claim 23, wherein the second wafer and the third wafer are made from silicon.

25. The method of claim 19, further comprising providing the thermopile with slots.

26. The method claim 25, further comprising supplying etching material through the slots to etch a cavity between the thermopile and the cap of the support chip.

27. The method of claim 19, wherein mating the support chip and the mating chip together includes bonding the support chip with the mating chip with a gold/tin alloy.

28. The method of claim 19, wherein mating the support chip and the mating chip together includes using gold—gold diffusion bonding.

29. The method of claim 19, wherein mating the support chip and the mating chip together includes using anodic bonding of silicon to a deposited layer of borosilicate glass.

30. The method of claim 19, wherein mating the support chip and the mating chip together includes bonding with solderglass frit.

* * * * *